United States Patent
Senninger et al.

(10) Patent No.: US 9,362,906 B2
(45) Date of Patent: Jun. 7, 2016

(54) SENSOR ARRANGEMENT FOR DETECTION OF PROXIMITY AND/OR TOUCHING, AS WELL AS A KIT AND METHOD FOR ASSEMBLING A SENSOR ARRANGEMENT

(75) Inventors: Christian Senninger, Otterfing (DE); Oliver Weiss, Munich (DE); Achim Rein, Munich (DE); Judith Ihle, Munich (DE); Oliver Wiesener, Munich (DE); Jens Vor Der Brüggen, Unterschleißheim (DE)

(73) Assignee: Schreiner Group GmbH & Co., KG, Oberschleißheim (DE)

( * ) Notice: Subject to any disclaimer, the term of this patent is extended or adjusted under 35 U.S.C. 154(b) by 408 days.

(21) Appl. No.: 13/824,328

(22) PCT Filed: Oct. 18, 2011

(86) PCT No.: PCT/EP2011/005223
§ 371 (c)(1),
(2), (4) Date: May 24, 2013

(87) PCT Pub. No.: WO2012/052152
PCT Pub. Date: Apr. 26, 2012

(65) Prior Publication Data
US 2013/0234782 A1    Sep. 12, 2013

(30) Foreign Application Priority Data

Oct. 21, 2010  (DE) .......................... 10 2010 049 007

(51) Int. Cl.
*H03K 17/94* (2006.01)
*H03K 17/96* (2006.01)
*H05K 3/00* (2006.01)

(52) U.S. Cl.
CPC .............. *H03K 17/94* (2013.01); *H03K 17/962* (2013.01); *H05K 3/0011* (2013.01); *H03K 2017/9606* (2013.01); *H03K 2217/960755* (2013.01); *H03K 2217/960785* (2013.01); *Y10T 29/49117* (2015.01)

(58) Field of Classification Search
None
See application file for complete search history.

(56) References Cited

U.S. PATENT DOCUMENTS

| | | |
|---|---|---|
| 2003/0122794 A1 | 7/2003 | Caldwell |
| 2009/0072883 A1 | 3/2009 | Ehrlich et al. |

(Continued)

FOREIGN PATENT DOCUMENTS

| | | |
|---|---|---|
| DE | 19650468 C1 | 3/1998 |
| DE | 10141634 A1 | 3/2003 |

(Continued)

OTHER PUBLICATIONS

International Search Report; PCT/EP2011/005223; Oct. 5, 2012.

*Primary Examiner* — Kenneth B Lee, Jr.
(74) *Attorney, Agent, or Firm* — Studebaker & Brackett PC

(57) ABSTRACT

A sensor arrangement for detection of proximity and/or touching including least one sensor supporting surface having a first flat face and a second flat face, a proximity and/or touching sensor which is connected to the first flat face and/or to the second flat face of the sensor supporting surface, a decoration supporting medium with a first support flat face and a second support flat face, a decoration layer which is connected to the first support flat face and/or to the second support flat face of the decoration supporting medium, and/or is an integral component of the decoration supporting medium. In this case, the sensor supporting surface and the decoration supporting medium are connected to one another such that a connection along their mutually facing flat face and support flat face is not formed, or is partially formed.

14 Claims, 3 Drawing Sheets

(56) References Cited

U.S. PATENT DOCUMENTS

Figure 1:
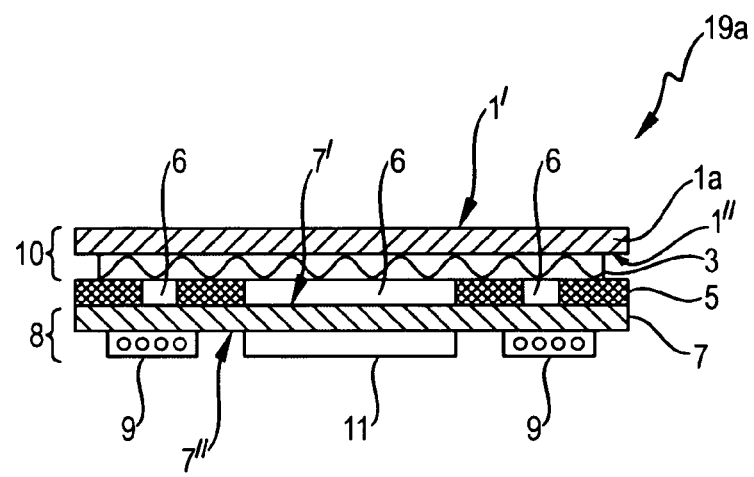

| | | |
|---|---|---|
| 2009/0269537 A1 | 10/2009 | Manabe |
| 2010/0155206 A1* | 6/2010 | Arione ................ H03K 17/962 200/314 |

FOREIGN PATENT DOCUMENTS

| | | |
|---|---|---|
| DE | 10307473 A1 | 9/2004 |
| DE | 10338614 A1 | 3/2005 |
| DE | 102004038752 A1 | 2/2006 |
| DE | 60219369 T2 | 12/2007 |
| DE | 102008028313 A1 | 12/2009 |
| EP | 1446879 A2 | 8/2004 |
| EP | 1626331 A2 | 2/2006 |
| EP | 1542363 B1 | 4/2007 |
| EP | 2048781 A1 | 4/2009 |
| EP | 2133997 A1 | 12/2009 |
| EP | 1446879 B1 | 5/2010 |
| WO | 03/044957 A2 | 5/2003 |
| WO | 2009/153161 A1 | 12/2009 |

* cited by examiner

SENSOR ARRANGEMENT FOR DETECTION OF PROXIMITY AND/OR TOUCHING, AS WELL AS A KIT AND METHOD FOR ASSEMBLING A SENSOR ARRANGEMENT

The present invention relates to a sensor arrangement for detecting proximity and/or touching, for example by a human finger. It also relates to a kit and a method for assembling such a sensor arrangement.

Sensor assemblies for detecting approaching or contacting objects are nowadays better known under the term "touch sensor". Touch sensors are applied in many technical fields, in particular, where simple, easy-to-use user interfaces need to be provided, which generate, in the manner of a simple switch for example, an electrical or electronic signal which is used to influence the operation of a electrically or electronically controlled component.

European Patent EP 1 446 879 B1 discloses, on the one hand, a novel form of touch sensors and outlines the previously known prior art in the design of touch sensors produced on the basis of films or substrates. The common feature of the embodiments described there is the fact that a decoration layer is used, which is positioned such that its position corresponds to that of a sensing element. This sensor element is implemented as an electrode which acts as part of a capacitor. The "detuning" of this capacitor indicates that an object, for example, a human finger, is located in the vicinity of the electrode. In the prior art described there the decoration layer is mounted on its own substrate, while the sensor electrode is applied on a second substrate. These two substrates are then connected to each other. In contrast, EP 1 446 879 B1 claims an invention in which the decoration layer is integrally connected to the sensor electrode or to its carrier substrate.

The problem addressed by the present invention is to provide an alternative construction of a sensor arrangement to the solutions previously described.

This problem is solved by a sensor arrangement according to claim 1.

Accordingly, a sensor arrangement of the above-mentioned type comprises at least
- a sensor supporting surface with a first flat face and a second flat face,
- a proximity and/or contact sensor, which is connected to the first flat face and/or the second flat face of the sensor supporting surface,
- a decoration supporting medium with a first support flat face and a second support flat face,
- a decoration layer, which is connected to the first support flat face and/or the second support flat face of the decoration supporting medium and/or is an integral part of the decoration supporting medium.

According to the invention the decoration supporting medium and the sensor supporting surface are connected together such that a connection along their mutually facing flat face and support flat face is not formed, or is only partially formed.

The sensor supporting surface is a planar substrate, for example in the form of a film or a panel. This substrate need not necessarily be completely flat, but may have contours, which means it may also be implemented as a three-dimensional component that is press-moulded as an essentially flat thin layer. Its surface need not necessarily be flat, but can also be curved. The proximity and/or contact sensor preferably comprises at least one electrode layer which is particularly preferably printed, advantageously by silk-screen printing technology, since this allows greater layer thicknesses to be achieved. The decoration supporting medium can also be constructed analogously to the sensor supporting surface, that is to say, again as a flat substrate as described in further detail above. The decoration layer can either be a separate layer, which is connected to one of the two support flat faces of the decoration supporting medium, or it can be integrated into the decoration supporting medium. Such an integration into the decoration supporting medium can be realized, for example, by a visible pigment of the decoration supporting medium.

These two basic elements, i.e. the sensor supporting surface with its touch sensor and the decoration supporting medium with its decoration layer, are then connected to each other. In doing so the invention departs from forming a full-surface connection along the mutually facing flat face and supporting flat face, as has been standard practice up to now. Rather, the two basic elements in accordance with a first variant are only partially connected to each other, that is to say in sub-regions over part of the surface, and according to a second variant, not at all. The connection in the case of the first variant is thus a locally selective one. This also includes the case that this local selection comprises a partial weakening of the connection effect, for example, a weakening of an adhesive action of an adhesive. The two variants are connected by the principle that a connection effect which is weakened compared to a full-surface connection, such as exists in accordance with the prior art, is realized between the two basic elements.

This results in some significant advantages which significantly differentiate the subject matter of the invention from the above-mentioned assemblies of sensor arrangements: firstly, in this way a releasable connection can be realized between the two basic elements, so that the two basic elements are more easily separable from each other, perhaps for purposes of separation during recycling or when replacing subcomponents of the sensor arrangement. Secondly, when connecting the two basic elements together, material, such as adhesive, can be saved. Thirdly, the connection can be made exactly at the point where it does not interfere with the operation of the sensor arrangement. Thus the connection (again, for example, an adhesive joint) can be prevented, for example, from interfering with the propagation of the electric field of the touch sensor. For this purpose it can be provided that the cutout of an adhesive is positioned exactly where the touch sensor is located, in a layer above or below it. Similar behaviour occurs when back-lighting the sensor assemblies, on which further details are given below. In general, this is because optical interference effects can be avoided by using such a connection means between the two basic elements, if this connection means is cut out at the locations where a user looks through any given layer of the sensor arrangement at an underlying layer. Fourthly, a further advantage is to be found in that the two basic elements can also be connected to each other in the manner according to the invention only during the installation of the sensor arrangement on site. Up to this point in time, the two basic elements can be held in stock as separate parts. It is thereby possible, for example, to produce one of the two basic elements, such as the sensor supporting surface with the touch sensor, in large quantities as a standard material, while the other basic element, preferably the decoration supporting medium with the decoration layer, can be individually configured as required and provided, for example, with a customer-specific and/or application-specific decoration. Such a specific decoration may provide, for example, labels in different languages and/or different symbols and/or other colours. Not until the precise application is known will the two basic elements be connected to each other, and this now occurs in a particularly simple manner: in the first variant, the advantage is that, for example, if the two basic elements are superimposed on each other inaccurately or incorrectly, the connection is still loose enough that the two basic elements can be separated again and correctly superimposed and connected. This allows the error rate when joining together the basic elements to be reduced. In the second variant the connection is effected for example by means of connecting elements which at least partially surround the two basic elements from the outside, such as housing parts in the display area of an electrical machine. To achieve this, the two basic elements must therefore only be inserted separately one on top of the other, and the housing parts closed up.

Hereafter, for the sake of accuracy, the basic elements are named as follows: the sensor supporting surface with a first flat face and a second flat face and the proximity and/or touch sensor, which is connected to the first flat face and/or the second flat face of the sensor supporting surface, are referred to as a sensor component. The second basic element is known as a decoration component. This comprises at least the decoration supporting medium with the first support flat face and the second support flat face, and preferably additionally a decoration layer, which is connected to the first support flat face and/or the second support flat face of the decoration supporting medium. The decoration supporting medium may also not be provided with the decoration layer, completely or partially, until later, namely just before the assembly, for example, by post-printing.

The kit of the above-mentioned type according to the invention comprises at least one such sensor component and one such decoration component, in addition to a connecting means for connecting the sensor supporting surface and the decoration supporting medium. This connecting means is designed such that, when used under the intended conditions, it makes a connection which is not formed along the mutually facing flat face and support flat face, or is only partially formed. With such a kit the properly executed connection can therefore produce a sensor arrangement according to the invention. As mentioned earlier, the use of such a kit has the advantage that individual customisations of the sensor component and, in particular, of the decoration component, are still possible up until the final installation of the sensor arrangement.

The method according to the invention of the above-mentioned type comprises at least the following steps:
 provision of a sensor supporting surface with a first flat face and a second flat face,
 connection of a proximity and/or touch sensor to the first flat face and/or the second flat face of the sensor supporting surface,
 provision of a decoration supporting medium with a first support flat face and a second support flat face,
 provision of a decoration layer by connection to the first support flat face and/or the second support flat face of the decoration supporting medium and/or by use of a decoration supporting medium, of which the decoration layer is an integral part,
 connection of the sensor supporting surface and the decoration supporting medium such that a connection along their mutually facing flat face and supporting flat face is not formed, or is only partially formed.

This method thus comprises the provision of the sensor component and the decoration component and their connection to each other.

Particularly preferably, the decoration supporting medium undergoes a forming process. It has therefore already been given a three-dimensional shape, which can be reinforced and therefore stabilized, for example by an injection-moulding material. Possible processes in this context are, for example, deep-drawing methods based on cold-working or hot-forming principles, as well as other processes, such as blow forming, rolling and many others.

Further particularly advantageous designs and extensions of the invention also arise from the dependent claims and the following description. The method according to the invention and the kit according to the invention can also be extended in accordance with the dependent claims to form the sensor arrangement and/or the kit, and in each case vice versa.

A particularly simple possible arrangement of the decoration supporting medium on the sensor supporting surface and corresponding to the connection of the two together is obtained if the decoration supporting medium comprises a glass or plastic film or panel. The term "glass" in the broad sense is also understood to include such flat materials as have the essential characteristics of glass panels, in particular similar hardness properties and scratch resistance characteristics. Thus for example, a plastic film provided with a hard coating, in particular with a scratch-resistant surface, can have such glass-like characteristics. Such films or panels are available in almost any desired thickness and their properties, in particular their flexibility, i.e. for example flexural strength, can be precisely adapted to the respective application type. A "panel" in this context can also be understood to include a three-dimensionally moulded plate-shaped structure, for example an injection moulded part. The panel can, therefore, also be implemented, for example, as part of a frame. The decoration supporting medium is preferably transparent (this is also to be understood in a broader sense to include translucent), in particular when the decoration layer is arranged on the support flat face that faces away from a user. The user can then identify the decoration layer underneath. This transparency is particularly advantageous when the sensor arrangement is backlit, as discussed in further detail below. A transparent design of the decoration supporting medium is also to be understood as including partial transparency. In addition to transparent areas, the decoration supporting medium can thus also have opaque areas.

To increase the stability of the decoration supporting medium, for example, this plastic film or panel of the decoration supporting medium can be back-moulded on the side of the first support flat face and/or the second support flat face with an injection-moulding material. The term "back-moulding" is to be understood as meaning any type of injection of an injection-moulding material directly or indirectly onto the decoration supporting medium. In addition to an injection process behind the decoration supporting medium, it also subsumes an over-moulding and an injection process, as well as any combination of these methods. In addition to providing reinforcement of the decoration supporting medium, this can also have the effect that the surface of the sensor arrangement thereby obtains a three-dimensional shape, for example, a shape which in addition to the decoration, indicates where a finger or other object must be moved near to the surface of the sensor arrangement in order to activate the proximity or contact sensor. In this manner, for example an additional Braille label can also be applied on the surface. A three-dimensional shape can also serve, however, to generate or to enhance visual effects, for example by the construction of a magnifying lens.

As far as the connection between the sensor component and the decoration component is concerned, it has already been mentioned that there are two basic alternatives.

The first alternative is that the connection comprises a surface connection implemented over a part of the surface. A partial connection therefore exists along the mutually facing surfaces of the sensor component and the decoration component, formed for example by welding (for example using ultrasound or similar). Particularly preferably however, this surface connection comprises an adhesive connection. In addition to adhesive joints using adhesives, this is also understood to mean such connections as are produced with curable adhesive paints or with similar substances based on adhesive action, which connect the sensor supporting surface and the decoration supporting medium to each other either permanently or non-permanently (i.e. releasably). Such adhesive joints are simple to produce, suitable adhesives for the purpose are available in almost limitless qualities, strengths and material compositions and can therefore be precisely matched to the exact installation location of the sensor arrangement.

A first extension of this embodiment with adhesive connection is realized by the adhesive joint having an adhesive surface with local cutouts. Such cutouts can be manufactured by producing so-called adhesive spots or by means of an adhesive lattice, for example by screen printing. Instead of printing however, the adhesive can also be laminated from another supporting medium in pre-fabricated form. Local cutouts can also be realized by producing an adhesive frame, by printing or other means. Such a frame is particularly preferred when, for example, adhesive is to be removed selectively in a decoration region of the sensor arrangement, in order to avoid the above-mentioned visual interference effects. The same applies to the cutout in a region of the contact and/or proximity sensor.

A second extension, which can be applied as an alternative to or in addition to the first extension, is that the adhesive joint has an adhesive surface, the adhesion of which is at least partially weakened. Such a reduction or complete elimination of the adhesion can be obtained by means of a so-called adhesive killer, for example, a partially applied print varnish, or by local application of a film, which in each case cover the adhesive or prevent application of the adhesive in this region. The local weakening of the adhesion offers the advantage that adhesive layers covering the whole surface can be used, such as those available in pre-assembled form, for example as a coated film substrate, in a large range of materials and properties. This then involves a standard material, which then need only be post-treated to partially reduce the adhesion. As already mentioned above, the weakening of the adhesion is also understood to mean a significant reduction of this effect in this local region, preferably by at least 50% of the local adhesive force.

The second alternative already indicated above is that no connection is realized on the contact surfaces of the sensor component and the decoration component. The connection is then achieved by holding together the sensor component and the decoration component elsewhere; preferably the connection then comprises a clamping connection. In such a clamping connection a direct surface connection between the mutually facing surfaces of the sensor component and the decoration component is not necessary. Particularly preferably, the clamping is achieved by means of a clamping frame. This can be implemented as part of the sensor component and/or the decoration component, and/or also comprise a separate part (and/or a plurality of parts) of the sensor component and/or the decoration component. It can therefore involve an additional clamping frame, which is implemented, for example, as part of a housing into which the sensor arrangement is fitted. Clamping has the advantage, in particular, that the connection need only be completed on-site at the time of the final installation of the sensor arrangement, wherein an earlier connection is of course also possible, at least in principle. In the context of this variant the kit according to the invention preferably has a clamping device as a connecting means. It should also be noted that in principle, the variants involving the partial surface connection and the clamping can also be combined with each other, for example, to initially tack the components together by means of the surface connection, and then using the clamping to provide additional contact force sufficient for the deployment of the sensor arrangement. As an alternative to clamping devices, for example, insertion sockets, bolted connections or rigid components can be used, which hold the sensor component and the decoration component together in the manner of a front and a rear wall of a picture frame. A clamping device can also be realized by forming it from an injection-moulded part, which is provided, for example, as part of the above-mentioned back-moulding process.

In addition, the sensor arrangement preferably has a lamp, which in operation emits light through both flat faces of the sensor supporting surface and/or through both support flat faces of the decoration supporting medium. In other words the sensor arrangement is back-lit, for which purpose all the layers of the sensor arrangement through which the light of the lamp is to be emitted are then preferably implemented as transparent or translucent. The back-lighting can be achieved particularly advantageously by the structure according to the invention, because the connection between the sensor component and the decoration component does not need to be provided in the area in which the light emits through. In particularly this allows unsightly smearing, formed by adhesive between the sensor component and/or the decoration component, to be avoided, as well as any unwanted light scattering and/or discolouration of the light.

Particularly preferably the lamp comprises an electroluminescence lamp having at least one light pigment layer between two electrode layers. Such an electroluminescence lamp, abbreviated as EL, can for example, be directly applied on the sensor component or the decoration support component and also partially applied on both, for example by screen printing. A particularly advantageous embodiment is characterised in that the EL is a so-called inorganic EL, the light pigment layer of which can be excited to light up by application of an AC voltage between the two electrode layers. Such ELs are simpler to produce than organic ELs and at the same time easier to handle, since they do not need to be protected so effectively against moisture. The overall structure of the sensor arrangement including the lamp is then therefore more robust, and it can be assumed to have a longer lifetime. As an alternative to inorganic ELs, polymer organic ELs (POLEDs) can preferably be used, which, in contrast to so-called small molecule OLEDs (SM-OLEDs—organic ELs based on small organic molecules) can be produced by printing techniques similarly to inorganic ELs, and which enable a higher luminance to be achieved than inorganic ELs.

Preferably, the EL is applied directly or indirectly on at least one of the flat faces and/or support flat faces of the sensor supporting surface and/or the decoration supporting medium. This means that intermediate layers, such as primers (adhesive primers), dielectrics or possibly even the decoration layer or the contact or proximity sensor, can be arranged between the sensor supporting surface and the decoration supporting medium. Even multiple such intermediate layers present no obstacle. If the EL is located between the sensor supporting surface and the decoration supporting medium or if it is covered on both sides by means of the sensor supporting surface or the decoration supporting medium in combination with another substrate, then its functional layers are protected by the respective substrates and also at the same time against external influences such as humidity and many other effects.

The EL can also be arranged partly on the sensor supporting surface and partly on the decoration supporting medium, for example one of the two electrode layers on the one component and the other on the other component, and the light pigment layer optionally on the one and/or the other. The EL then only becomes operational due to the connection of the two components.

In principle, it is possible to arrange the lamp and the proximity and/or contact sensor on different flat faces of the sensor supporting surface. However, it has proved particularly advantageous to position the lamp on the same flat face of the sensor supporting surface on which the proximity and/or contact sensor is arranged. This enables an electrical contact to be made on only one flat face, which makes the arrangement of the sensor arrangement, and also its maintenance, significantly simpler.

The lamp, in particular an EL, and the proximity or contact sensor can be applied one on top of the other, with the electrode of the sensor even forming one of the two electrodes of the EL. Completely separated electrodes of the EL and the sensor can also be implemented however, which are then preferably electrically insulated from each other, for example, by means of an intermediate insulation layer.

The proximity and/or contact sensor and the lamp are preferably arranged side by side along an extension defined by the plane of extension of the sensor supporting surface. This even allows the lamp and the sensor to be arranged together on one and the same substrate and, if spaced sufficiently far apart, to be automatically insulated from each other. In this context, it is especially advantageous if the proximity and/or contact sensor is arranged in this extension around a region in which the lamp is positioned, or if the lamp is positioned in the extension around a region in which the proximity and/or contact sensor is positioned. Such an arrangement of the lamp around the sensor, or of the sensor around the lamp, particularly preferably has an annular design (that is, partially circular, oval or as part of an oval shape). Expressed more generally, a contour-tracking arrangement is preferably provided, in which the internal contour of the externally positioned lamp or of the externally positioned proximity and/or contact sensor is matched to the outer contour of the internally located proximity and/or contact sensor or of the internally located lamp.

In the following the invention is explained once again in more detail with reference to the attached figures and based on an exemplary embodiment. Equivalent components in the various figures are each labelled with the same reference numerals. In the Figures:

FIG. 1 shows a schematic cross-sectional view of a first embodiment of a sensor arrangement according to the invention, FIG. 2 the same sensor arrangement viewed from below, FIG. 3 a schematic cross-sectional view of a second embodiment of a sensor arrangement according to the invention, FIG. 4 a schematic cross-sectional view of a third embodiment of a sensor arrangement according to the invention, FIG. 5 a schematic block diagram of a sequence of an embodiment of the method according to the invention, FIG. 6 a schematic cross-sectional view of an EL, as is preferably used in the embodiments of the sensor assemblies according to the invention in accordance with FIGS. 1 to 4.

Figure 2:
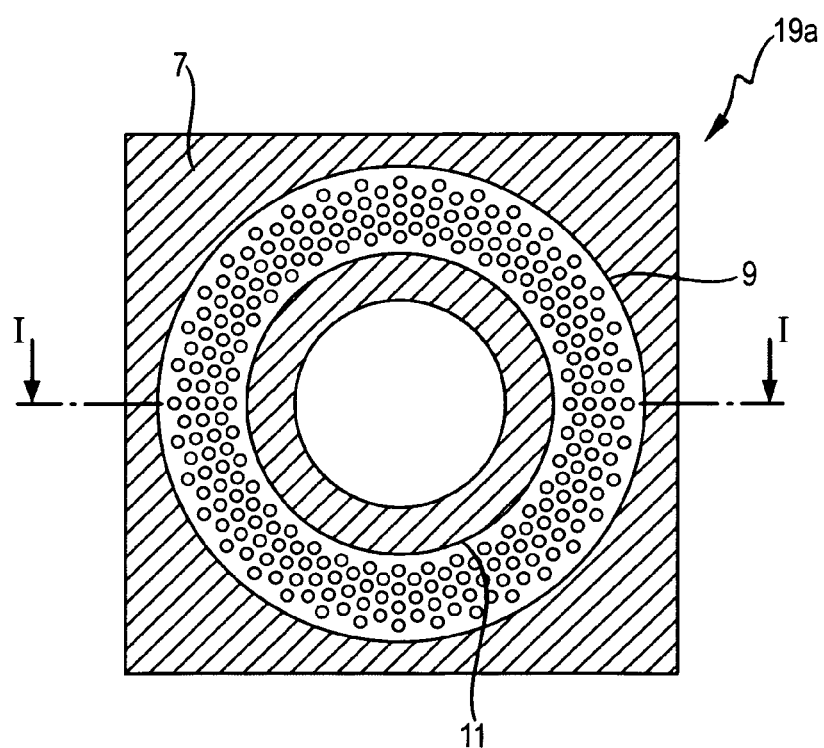

FIGS. 1 and 2 show a section of a sensor arrangement 19a along a line I-I (shown in FIG. 2) and in a view from below. Electrical contacts of the sensor arrangement 19a (as in the following FIGS. 3 and 4 also) are not shown. The sensor arrangement 19a comprises a sensor component 8 and a decoration component 10, which are connected to each other over part of the surface, i.e. by forming cutouts 6 by means of an adhesive 5. By means of this partial bonding, the sensor component 8 and the decoration component 10 can be more easily detached from each other and recycled separately. Further advantages of this partial connection are described in detail above. The sensor component 19a comprises a sensor supporting surface 7, here a film 7, with a first flat face 7' and a second flat face 7". On the second flat face 7" a proximity sensor 9 is arranged annularly in the form of an electrode 9, as well as a lamp 11 which is implemented as an EL 11. The more precise structure of an EL 11 which can be used for this purpose is shown in FIG. 6. The proximity sensor 9 is separated from the EL 11 such that the two are electrically isolated from each other and arranged annularly around it. As a result, in the entire region from the outer boundary of the proximity sensor 9 right into the centre of the EL 11, a sensor action of the proximity sensor 9 is obtained if a user's finger, for example, approaches from the top of the sensor arrangement 19a, i.e. from the side thereof opposite the proximity sensor 9. The decoration component 10 comprises a decoration supporting medium and a film 1, having a first support flat face 1' and a second support flat face 1", wherein a decoration layer 3, here applied by printing, is arranged on the second support flat face 1". The decoration layer 3 is translucent, so that the light emitted by the EL 11 can radiate through it. The decoration supporting medium 1 and the sensor supporting surface 7 are transparent, so that the light from the EL 11 can radiate through it practically unfiltered. A particularly advantageous effect is obtained by no adhesive 5 being arranged in the area in which the light of the EL 11 radiates upwards, i.e. because this is where one of the cutouts 6 is present. This prevents adhesive 5 from obstructing the passage of light radiation in this area.

A kit according to the invention for producing the sensor arrangement 19a separately comprises the sensor component 8 and the decoration component 10 and the adhesive 5, which is stored, for example, on a silicon substrate already provided with cutouts 6 and 8 and can be laminated at any time onto the sensor component 8 or the decoration component 10, in order to partially connect the two together.

Figure 3:
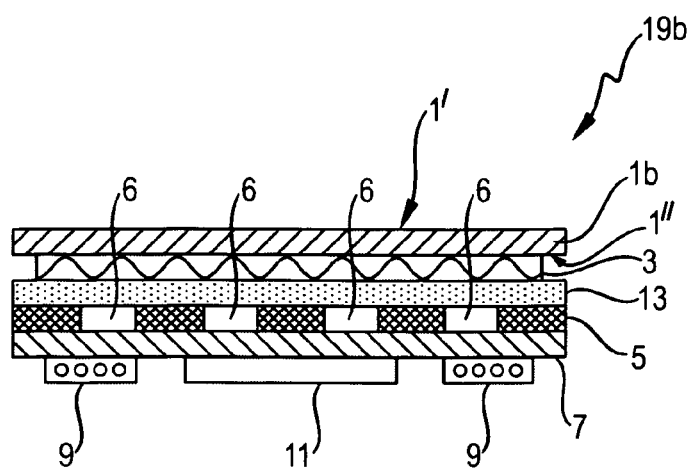

FIG. 3 shows a cross-sectional view of a second embodiment of a sensor arrangement 19b according to the invention. This differs from the previously described design firstly in that adhesive 5 is now also located in the region in which light from the EL 11 radiates upwards. Secondly, in this case a decoration supporting medium 1b is formed from a more stable material, namely a plastic panel 1b. This plastic panel 1b is thirdly fitted with a plastic back-moulding 13. This back-moulding 13 stabilises the overall structure of the sensor arrangement 19b and also protects the decoration layer 3 from the adhesive 5. Such a back-moulding can also be arranged on the first support flat face 1' or on both support flat faces 1', 1". The structure of the sensor arrangement 19b shown here is particularly dimensionally stable and flexurally rigid in comparison to the previously described sensor arrangement 19a (FIGS. 1 and 2).

Figure 4:
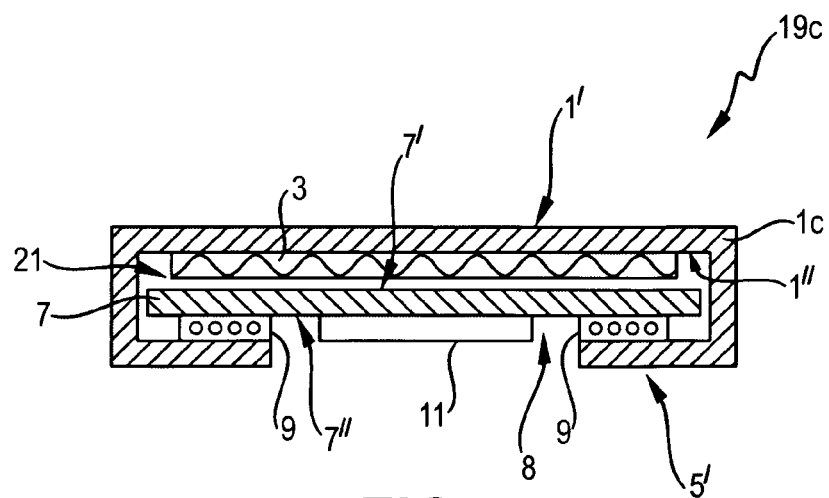

FIG. 4 shows a cross-sectional view of a third embodiment of a sensor arrangement 19c according to the invention. Here the sensor supporting surface 7, along with the proximity sensor 9 and the EL 11, is connected by clamps to a decoration supporting medium 1c, which here is a clamping frame made from a plastic injection-moulded part. For this purpose a clamping device 5', implemented as a clamping area of the decoration supporting medium 1c, comprises the bottom of the sensor component 8. Between the sensor supporting surface 7 and the decoration layer 3, which is arranged on the inner side of the decoration supporting medium 1c, there is therefore a small gap 21, here shown exaggerated in size. This means that no permanent connection exists between the sensor supporting surface 7 and the decoration layer 3. The gap 21 may be reduced practically to zero by the clamping connection, but before the clamping takes place it is initially present. Such a clamping connection as is realized in the sensor arrangement 19c can however, if necessary, be additionally supplemented by a partial bond.

Figure 5:
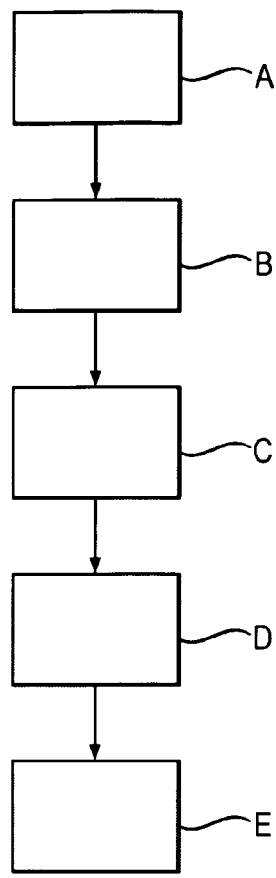

FIG. 5 shows schematically the sequence of an embodiment of a production method according to the invention for producing the sensor arrangement 19a in accordance with FIGS. 1 and 2. In a first step A the sensor supporting surface 7 is provided. In a second step B the proximity sensor 9 is connected to the second flat face 7' of the sensor supporting surface 7. In addition, in a third step C the decoration supporting medium 1a is provided, as is, in a fourth step D, the decoration layer 3, which is connected to the first supporting flat face 1' of the decoration supporting medium 1a. These steps A, B, C, D mentioned can be carried out in virtually any order, also in various places, with the exception that step B must necessarily follow step A and step D must necessarily follow step C. In a fifth step E, the sensor supporting surface 7 and the decoration supporting medium is are connected to each other by means of the partial adhesive layer 5.

Figure 6:
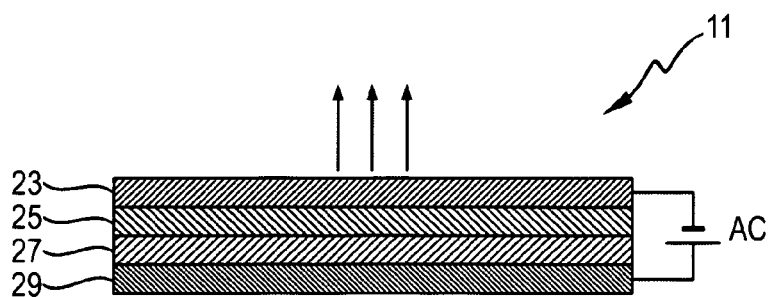

FIG. 6 shows for the purposes of explanation a schematic cross-sectional view of an EL 11, such as can be used, for example, in the previously described embodiments of the sensor arrangements 19a, 19b, 19c. It comprises a first electrode layer 23, a dielectric layer 27, a light pigment layer 25 and a second electrode layer 29. All the layers 23, 25, 27, 29 are printed onto the second flat face 7" by the silk screen printing method (cf. FIGS. 1 to 4). By applying an AC voltage AC across the two electrode layers 23, 29, the light pigment layer 25 is excited into illumination. The first electrode layer 23 is transparent, while the second electrode layer 29 exhibits a light reflecting effect, so that the light is radiated upwards. The dielectric layer 27 is used to prevent flashovers between the two electrode layers 23, 29.

To conclude it will once again be pointed out that the sensor assemblies described above are merely exemplary embodiments, which can be modified in a variety of ways by the person skilled in the art without departing from the scope of the invention. Furthermore, the use of the indefinite article "a" does not exclude the possibility that the features concerned may also be present more than once.

LIST OF REFERENCE LABELS 1a decoration supporting medium—film
1b decoration supporting medium—plastic panel
1c decoration supporting medium—clamping frame
1' first support flat face
1" second support flat face
3 decoration layer
5 adhesive
5' clamping device.
6 cutouts
7 sensor supporting surface—film
7' first flat face
7" second flat face
8 sensor component
9 proximity sensor—electrode
10 decoration component
11 lamp—electro-luminescence lamp
13 back moulding
19a, 19b, 19c sensor arrangement
21 gap
23 first electrode layer
25 light pigment layer
27 dielectric layer
29 second electrode layer
A step—providing a sensor supporting surface
B step—connecting a proximity sensor
C step—providing a decoration supporting medium
D step—connection of a decoration layer
E step—connection of sensor supporting surface and decoration support medium

The invention claimed is:

1. Sensor arrangement for detecting proximity and/or touching, comprising at least:
   a sensor supporting surface with a first flat face and a second flat face,
   a proximity and/or touch sensor, which is connected to the first flat face and/or the second flat face of the sensor supporting surface,
   a decoration supporting medium with a first support flat face and a second support flat face, and
   a decoration layer, which is connected to the first support flat face and/or the second support flat face of the decoration supporting medium and/or is an integral part of the decoration supporting medium,
   wherein the sensor supporting surface and the decoration supporting medium are connected to each other such that a connection along their mutually facing flat face and support flat face is not made, or is partially made,
   wherein the decoration supporting medium comprises a plastic film or panel, and
   wherein the plastic film or panel is back-moulded on the side of the first support flat face and/or the second support flat face with an injection-moulding material.

2. Sensor arrangement for detecting proximity and/or touching, comprising at least:
   a sensor supporting surface with a first flat face and a second flat face,
   a proximity and/or touch sensor, which is connected to the first flat face and/or the second flat face of the sensor supporting surface,
   a decoration supporting medium with a first support flat face and a second support flat face, and
   a decoration layer, which is connected to the first support flat face and/or the second support flat face of the decoration supporting medium and/or is an integral part of the decoration supporting medium,
   wherein the sensor supporting surface and the decoration supporting medium are connected to each other such that a connection along their mutually facing flat face and support flat face is not made, or is partially made,
   wherein the connection comprises a surface connection implemented over a part of the surface,
   wherein the surface connection comprises an adhesive connection, and
   wherein the adhesive connection has an adhesive surface, the adhesion effect of which is locally weakened, at least partially.

3. Sensor arrangement according to claim 2, wherein the adhesive connection has an adhesive surface with local cutouts.

4. Sensor arrangement for detecting proximity and/or touching, comprising at least:
   a sensor supporting surface with a first flat face and a second flat face, a proximity and/or touch sensor, which is connected to the first flat face and/or the second flat face of the sensor supporting surface, a decoration supporting medium with a first support flat face and a second support flat face, and a decoration layer, which is connected to the first support flat face and/or the second support flat face of the decoration supporting medium and/or is an integral part of the decoration supporting medium, wherein the sensor supporting surface and the decoration supporting medium are connected to each other such that a connection along their mutually facing flat face and support flat face is not made, or is partially made, and wherein the connection comprises a clamp connection.

5. Sensor arrangement for detecting proximity and/or touching, comprising at least:

a sensor supporting surface with a first flat face and a second flat face, a proximity and/or touch sensor, which is connected to the first flat face and/or the second flat face of the sensor supporting surface, a decoration supporting medium with a first support flat face and a second support flat face, a decoration layer, which is connected to the first support flat face and/or the second support flat face of the decoration supporting medium and/or is an integral part of the decoration supporting medium, and a lamp, which in operation emits light through both flat faces of the sensor supporting surface, and/or through both support flat faces of the decoration supporting medium, wherein the sensor supporting surface and the decoration supporting medium are connected to each other such that a connection along their mutually facing flat face and support flat face is not made, or is partially made.

6. Sensor arrangement according to claim 5, wherein the lamp comprises an electroluminescence lamp with at least one light pigment layer between two electrode layers.

7. Sensor arrangement according to claim 6, wherein the electroluminescence lamp is applied directly or indirectly on at least one of the flat faces and/or the support flat faces of the sensor supporting surface and/or of the decoration supporting medium.

8. Sensor arrangement according to claim 1, wherein the proximity and/or touch sensor and the lamp are arranged side by side in an extension defined by the plane of extension of the sensor supporting surface.

9. Sensor arrangement according to claim 3, wherein the proximity and/or touch sensor and the lamp are arranged side by side in an extension defined by the plane of extension of the sensor supporting surface.

10. Sensor arrangement according to claim 4, wherein the proximity and/or touch sensor and the lamp are arranged side by side in an extension defined by the plane of extension of the sensor supporting surface.

11. Sensor arrangement according to claim 5, wherein the proximity and/or touch sensor and the lamp are arranged side by side in an extension defined by the plane of extension of the sensor supporting surface.

12. Sensor arrangement according to claim 1, wherein the connection comprises a surface connection implemented over a part of the surface, wherein the surface connection comprises an adhesive connection, and wherein the adhesive connection has an adhesive surface with local cutouts.

13. Sensor arrangement according to claim 4, wherein the connection comprises a surface connection implemented over a part of the surface, wherein the surface connection comprises an adhesive connection, and wherein the adhesive connection has an adhesive surface with local cutouts.

14. Sensor arrangement according to claim 5, wherein the connection comprises a surface connection implemented over a part of the surface, wherein the surface connection comprises an adhesive connection, and wherein the adhesive connection has an adhesive surface with local cutouts.

* * * * *